(12) United States Patent
Grede et al.

(10) Patent No.: US 11,382,206 B2
(45) Date of Patent: Jul. 5, 2022

(54) MULTI-STACK COOLING STRUCTURE FOR RADIOFREQUENCY COMPONENT

(71) Applicant: Comet AG, Flamatt (CH)

(72) Inventors: André Grede, Bern (CH); Daniel Gruner, Müllheim (DE); Anton Labanc, Ehrenkirchen (DE)

(73) Assignee: COMET AG, Flamatt (CH)

( * ) Notice: Subject to any disclaimer, the term of this patent is extended or adjusted under 35 U.S.C. 154(b) by 0 days.

(21) Appl. No.: 17/269,461

(22) PCT Filed: Aug. 20, 2018

(86) PCT No.: PCT/US2018/047091
§ 371 (c)(1),
(2) Date: Feb. 18, 2021

(87) PCT Pub. No.: WO2020/040725
PCT Pub. Date: Feb. 27, 2020

(65) Prior Publication Data
US 2021/0259092 A1 Aug. 19, 2021

(51) Int. Cl.
*H05K 1/02* (2006.01)
*H05K 1/16* (2006.01)

(52) U.S. Cl.
CPC .......... *H05K 1/0204* (2013.01); *H05K 1/021* (2013.01); *H05K 1/0239* (2013.01); *H05K 1/165* (2013.01); *H05K 2201/10416* (2013.01)

(58) Field of Classification Search
CPC ....... H05K 1/0201–021; H05K 1/0239; H05K 1/165; H05K 1/181; H05K 3/0058–0061; H05K 3/341; H05K 7/06; H05K 7/20218; H05K 7/20254–20263; H05K 7/2039; H05K 7/20463; H05K 7/20472; H05K 7/205; H05K 7/2089–209; H05K 7/20927–20936; H05K 7/1448;
(Continued)

(56) References Cited

U.S. PATENT DOCUMENTS 10,199,904 B2 * 2/2019 Sasaki ............... H05K 1/09
2005/0201069 A1 * 9/2005 Kirigaya ........... H05K 1/0203
361/752

(Continued)

FOREIGN PATENT DOCUMENTS

JP S61214453 A 9/1986

*Primary Examiner* — Zachary Pape
*Assistant Examiner* — Amir A Jalali
(74) *Attorney, Agent, or Firm* — The Webb Law Firm

(57) ABSTRACT

An apparatus which includes: a circuit board having a radiofrequency (RF) structure at a first location thereof, the RF structure formed from a conductive trace of the circuit board; a heat carrier; and a multi-stack cooling structure coupling the circuit board and the heat carrier to each other. The multi-stack cooling structure including a first stack adjacent the RF structure at the first location and a second stack at a second location. The first stack including a dielectric layer adjacent the heat carrier, and a thermal interface material (TIM) that couples the dielectric layer and the circuit board to each other, the dielectric layer having higher thermal conductivity and higher rigidity than the TIM. The second stack including a metal layer adjacent the heat carrier, and the TIM that couples the metal layer and the circuit board to each other.

15 Claims, 11 Drawing Sheets

(58) Field of Classification Search
CPC ... H05K 7/20509; H05K 2201/06–068; H05K 2201/10416; H01L 23/3672; H01L 23/3735; H01L 23/427; H01L 23/473; H01F 27/2804; H01F 27/2876; H01H 9/52

See application file for complete search history.

(56) References Cited

U.S. PATENT DOCUMENTS

| | | | |
|---|---|---|---|
| 2006/0158855 A1* | 7/2006 | Wilson | H05K 1/0204 257/E23.09 |
| 2015/0160701 A1* | 6/2015 | Bruno | H01L 23/5389 361/679.31 |
| 2016/0035481 A1 | 2/2016 | Hachiya et al. | |
| 2018/0132348 A1* | 5/2018 | Berkel | H05K 3/4697 |
| 2018/0177037 A1* | 6/2018 | Koller | H05K 9/0024 |

* cited by examiner

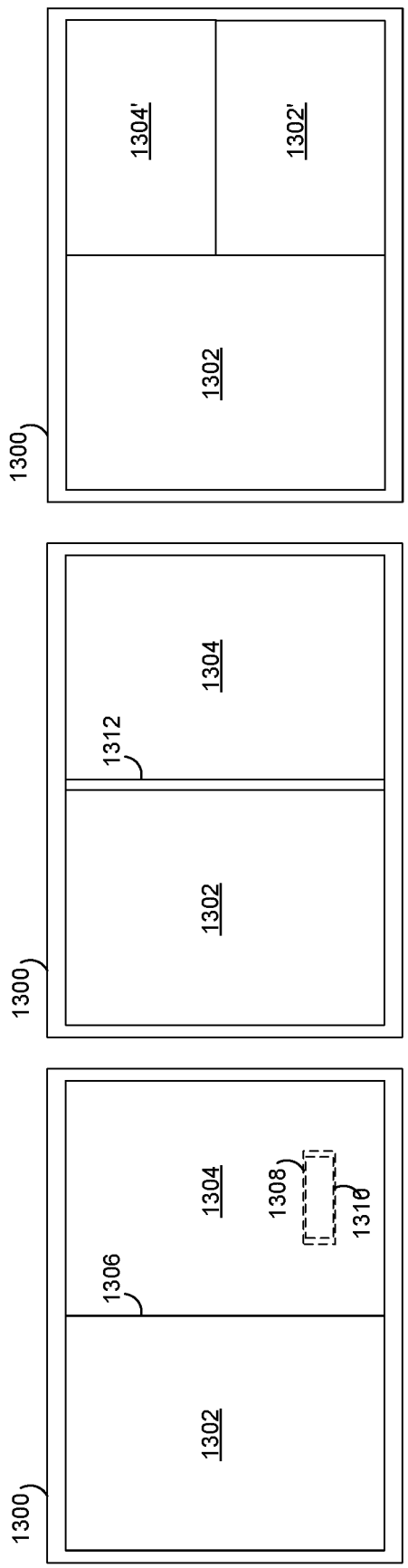

MULTI-STACK COOLING STRUCTURE FOR RADIOFREQUENCY COMPONENT

CROSS-REFERENCE TO RELATED APPLICATION

This application is the United States national phase of International Application No. PCT/US2018/047091 filed Aug. 20, 2018, the disclosure of which is hereby incorporated by reference in its entirety.

BACKGROUND

Field of the Invention

This document relates, generally, to a multi-stack cooling structure for a radiofrequency component.

Description of Related Art

Some radiofrequency (RF) power components or modules include planar power RF structures such as inductors, transformers or transmission lines. During operation, such RF power components may generate significant amounts of heat. It may therefore be necessary or desirable to cool the RF power component.

Some RF components work with frequencies in the microwave range (e.g., 300 MHz to 300 GHz) or higher. For such RF components, a heatsink can be directly bonded to a printed circuit board (PCB) on which the RF component is implemented. In such situations, a relatively close proximity of a metal heatsink to the RF component may be acceptable because the RF component requires relatively low inductance of inductive elements and/or low impedance of transmission lines. For lower frequencies, this may not be the case.

SUMMARY OF THE INVENTION

In a first aspect, an apparatus includes: a circuit board having a radiofrequency (RF) structure at a first location thereof, the RF structure formed from a conductive trace of the circuit board; a heat carrier; and a multi-stack cooling structure coupling the circuit board and the heat carrier to each other, the multi-stack cooling structure including a first stack adjacent the RF structure at the first location and a second stack at a second location, the first stack including a dielectric layer adjacent the heat carrier, and a thermal interface material (TIM) that couples the dielectric layer and the circuit board to each other, the dielectric layer having higher thermal conductivity and higher rigidity than the TIM, the second stack including a metal layer adjacent the heat carrier, and the TIM that couples the metal layer and the circuit board to each other.

Implementations can include any or all of the following features. The TIM includes at least one of thermal pad, adhesive, bonding film, matrix-fiber aggregate, solder, or glue. The RF structure has a central opening, the apparatus further comprising at least one component on the circuit board aligned with the central opening. The RF structure includes at least one of an inductor, a transformer, or a transmission line. The circuit board has a first layer facing the multi-stack cooling structure, and a second layer opposite the first layer. The RF structure is located at the first layer. The dielectric layer includes at least one of a ceramic material or a ferromagnetic ceramic material. The dielectric layer and the metal layer have a common shape. The dielectric layer and the metal layer have a common size. The apparatus further comprises a plating on a surface of the metal layer. The plating includes at least one of tin or gold. The multi-stack cooling structure includes more than two stacks between the circuit board and the heat carrier. The apparatus further comprises a power component mounted to the metal layer. The apparatus further comprises a recess in the circuit board that accommodates the power component.

In a second aspect, an apparatus includes: a printed circuit board having a radiofrequency (RF) structure at a first location of a first surface thereof, the printed circuit board having a second surface opposite the first surface, the RF structure formed from a conductive trace of the printed circuit board and including at least one of an inductor, a transformer, or a transmission line; a heat carrier including at least one of a heatsink or a water cooling plate; and a multi-stack cooling structure coupling the printed circuit board and the heat carrier to each other, the multi-stack cooling structure including a first stack adjacent the RF structure at the first location and a second stack at a second location, the first stack including a dielectric pad coupled to the heat carrier, and a thermal interface material including at least one of thermal pad, adhesive, bonding film, matrix-fiber aggregate, solder, or glue, that couples the dielectric pad and the printed circuit board to each other, the dielectric pad having higher thermal conductivity and higher rigidity than the thermal interface material, the second stack including a metal layer coupled to the heat carrier, the metal layer coupled to the first surface of the printed circuit board, the first stack being adjacent the second stack.

BRIEF DESCRIPTION OF DRAWINGS

FIGS. 13A-C show examples of arrangements with circuit boards.

DETAILED DESCRIPTION OF THE INVENTION

Figure 1:
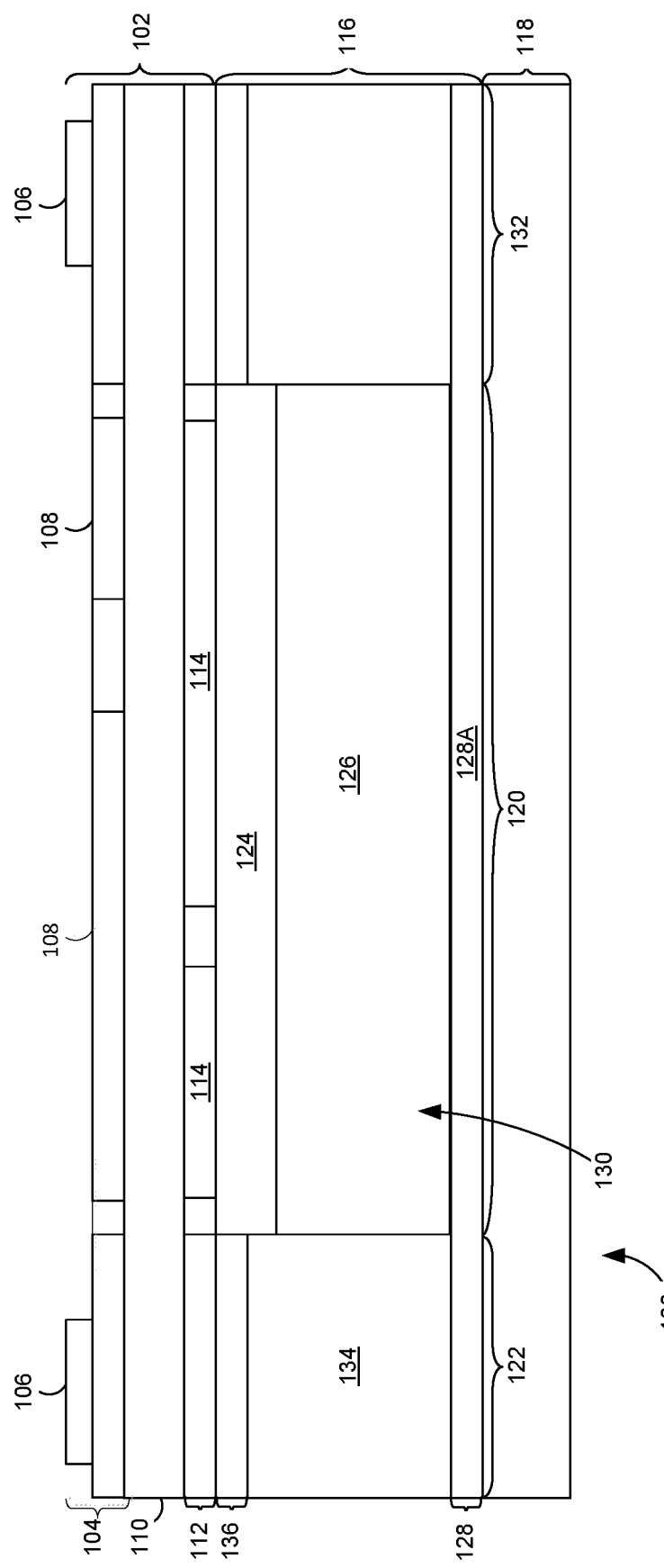
FIG. 1 shows an example of an apparatus.

This document describes examples of cooling stacks that can be built up between a heatsink and a circuit board (e.g., a PCB). Cooling of planar RF structures can be provided in some implementations. Forced cooling can be provided for planar power RF structures. A hybrid layer stack can be provided to cool planar RF power structures.

RF circuits with frequencies lower than the microwave range (e.g., in the range of about a fraction of a MHz to about on the order of 100 MHz) can typically have higher inductance of inductive components and/or higher impedances of transmission lines than in higher-frequency circuits. Examples of apparatuses associated with such lower frequencies include, but are not limited to, generators for RF power delivery. For example, and without limitation, RF power generators can be used in fields such as semiconductor manufacturing; manufacturing of LED displays or LCDs; thin film deposition, including for photovoltaic systems such as solar panels; plasma research, such as in cyclotrons; industrial or medical applications; and/or laser power supplies.

Due to the higher inductance and/or higher impedance in sub-microwave RF generators it may not be possible or practical to directly bond an electrically conductive heatsink or other mechanical heat carrier to a PCB (which heat carriers are usually connected to ground potential). A close presence of such a metallic component would significantly reduce the inductance or impedance by destructive superposition of the magnetic field of the RF component with the magnetic field of eddy currents in the heat carrier. Moreover, making the PCB thicker may not be an acceptable solution because the thermal resistance is typically too high so that the cooling is insufficient.

A multi-stack cooling structure can be provided that includes different and better thermally conductive materials compared to thermally conductive PCB materials. In some implementations, the circuit board can be bonded to a multi-stack cooling structure that includes a frame featuring one or more cutouts or cavities. As an example, the multi-stack cooling structure can be mounted to the heat carrier. A cavity can be provided in the multi-stack cooling structure where additional room with good thermal conductivity but electric insulating is needed. For example, a cavity can be provided adjacent an RF structure such as an inductive element or a transmission line. The cavity can be at least partially filled with one or more good thermally conductive inlays (e.g., a plate) and one or more thermal interface materials between the circuit board and the inlay. The thermal interface material is soft at least during the production process. For example, if glue or laminate is used, the thermal interface layer will subsequently be hardened after height tolerances have been compensated. A thermal interface material can also or instead be provided between the inlay and a heatsink or other heat carrier. This stack can provide cooling of the RF structure without significant detrimental effects on inductance and/or impedance. Another area of the circuit board, such as where components without inductive properties are located, can be cooled directly through another stack formed by the frame. This can provide heat spreading and reduction of thermal resistance. The thickness of the frame and/or other portions of such a stack can be chosen accordingly.

FIG. 1 shows an example of an apparatus 100. The apparatus 100 can be part of an RF apparatus according to any example described herein. The apparatus 100 includes a circuit board 102. In some implementations, the circuit board 102 is a PCB. For example, the circuit board 102 can have conductive traces forming and/or connecting components of the apparatus 100.

The circuit board 102 can include a top layer 104. The top layer 104 can include one or more components and/or conductive traces of the circuit board 102, here schematically shown in the figure for illustration purposes. In some implementations, a component 106 can be considered a "lumped" component. For example, the component 106 as schematically shown can represent at least one capacitor and/or at least one resistor. Some components of the apparatus 100 can include RF structure and can work with signals having one or more frequencies, such as a sub-microwave frequency. For example, an already amplified, high-power signal can pass through a passive component to match a load impedance to power transistors and/or to provide filtering. In some implementations, an RF structure 108 can include or be part of an inductor, a transformer or a transmission line. For example, the RF structure 108 can be formed from a conductive trace of the circuit board 102 (e.g., a copper trace). The top layer 104 can be formed at a core 110 of the circuit board 102. In some implementations, the core 110 can include a PBC substrate.

The circuit board 102 can include a bottom layer 112 formed at the core 110. The bottom layer 112 can include one or more components and/or conductive traces of the circuit board 102. In some implementations, an RF structure 114 can include or be part of an inductor, a transformer or a transmission line. For example, the RF structure 114 can be formed from a conductive trace of the circuit board 102 (e.g., a copper trace). The terms top and bottom are used only for illustrative purposes regarding the present drawing.

The RF structure 108 and/or 114 can be referred to as a planar RF structure. An RF component can be considered a planar RF structure when formed from a conductive trace of the circuit board (e.g., by etching of a metal layer that is positioned at the core 110). For example, a planar RF structure can include an inductor, a transformer and/or a transmission line.

The apparatus 100 here includes a multi-stack cooling structure (MSCS) 116 for the circuit board 102. The MSCS 116 can serve to remove dissipated heat from the circuit board 102 while facilitating that the components/structures of the circuit board 102 have desired and reproducible inductance and/or impedance. The MSCS 116 is positioned between the circuit board 102 and a heat carrier 118. In some implementations, the MSCS 116 can be positioned adjacent (e.g., abutting) the bottom layer 112. For example, the MSCS 116 can be positioned against the RF structure 114. The heat carrier 118 can include a structure capable of removing heat from the MSCS 116. For example, and without limitation, the heat carrier 118 can include a heatsink (e.g., a metal structure), a water cooling plate and/or another heat-transferring mechanical carrier.

The MSCS 116 can include two or more stacks that, in the same or different ways from each other, will serve to facilitate removal of thermal energy from the circuit board 102. Here, the MSCS 116 includes at least a stack 120 and a stack 122. Each stack of the MSCS 116 can include two or more layers. In some implementations, the stack 120 includes a thermal interface material (TIM) 124, an inlay 126, and a portion 128A that is part of a layer 128. The portion 128A here forms one end of the stack 120 and is positioned adjacent (e.g., abutting) the heat carrier 118. At the other end of the stack 120, the TIM 124 is positioned adjacent (e.g., abutting) the bottom layer 112 of the circuit board 102. For example, the TIM 124 can be positioned adjacent the RF structure 114.

The TIM 124 can serve as a soft thermal interface that provides thermal connection between the circuit board 102 and the inlay 126. The TIM 124 is electrically insulating. In some implementations, the TIM 124 can include a thermal pad, adhesive, a bonding film, a matrix-fiber aggregate, solder, and/or glue. In some implementations, a matrix-fiber aggregate can be formed of fibers dispersed in a polymer matrix. For example, the matrix-fiber aggregate can include pre-impregnated composite fibers, or pre-preg. The TIM 124 can serve to compensate for one or more discrepancies in the apparatus 100. For example, the TIM 124 can compensate for a mechanical tolerance (e.g., a variation in one or more sizes, such as of the stack 122) that is deemed to be within the design parameters for the apparatus 100. As another example, the TIM 124 can fill up voids between the bottom layer 112 and the inlay 126.

The inlay 126 can be a relatively rigid piece of material with good thermal conductance that provides electrical insulation. The inlay 126 can provide a thermally conducting, electrically insulating bridge between the circuit board 102 and the heat carrier 118. In some implementations, the inlay 126 has higher thermal conductivity than the TIM 124. The inlay 124 has higher rigidity than the TIM 124. For example, the inlay 126 can be chosen to have the largest size that fits within as cavity 130 that is formed between the stack 122 and another stack 132 that is here on the opposite side of the stack 120 from the stack 122. For example, a piece of stock material or a plate can be customized in size to fill the cavity 130 as much as possible, and the TIM 124 can then compensate by filling some or all of the remaining space. The material of inlay 126 can be chosen such as to provide a good tradeoff between thermal conductivity and cost of the material. The thickness of inlay 126 can be chosen such as to provide a good tradeoff between the total thermal conductivity and efficient compensation of mechanical tolerances.

The inlay 126 can be made from one or more materials that provide suitable thermal conductivity and electrical insulation. In some implementations, the inlay 126 can include a ferromagnetic ceramic material such as ferrite, a ceramic material such as $Al_2O_3$ or AlN, and/or another thermally conductive rigid material. The thermal conductivity of the inlay 126 may be less than that of a metal yet the inlay 126 can be used to provide cooling for the circuit board 102 without significant deterioration of inductance and/or impedance.

The portion 128A (e.g., thermal grease) can be part of an entire layer (here the layer 128) that can span multiple or all stacks (here stacks 120, 122 and 132) of the MSCS 116. The portion 128A should provide good contact (e.g., to compensate for roughness) and good thermal conductivity between, on the one hand, the other parts of the stack 120 (here most directly the inlay 126), and, on the other hand, the heat carrier 118. In some implementations, another material can instead or additionally be used. For example, the portion 128A (or the entire layer 128) can include a thermal pad, adhesive, bonding film, a matrix-fiber aggregate, solder and/or glue.

The stack 122 of the MSCS 116 can include a frame 134. The frame 134 can be a thermally conductive structure coupled to the circuit board 102 that facilitates removal of heat from some portions of the circuit board 102 to the heat carrier 118. The frame 134 can be electrically conductive. The frame 134 can have one or more cavities or openings. For example, the cavity 130 which accommodates the stack 120 between the stacks 122 and 132 can be provided by the frame 134. The frame 134 can be made of PCB substrate (including, but not limited to, clad metal, polymer foil, cloth and/or paper) or metal (including, but not limited to, copper). The frame 134 can be provided in the stack 122 or in the stack 132, or both. The frame 134 can provide direct cooling of one or more areas of the circuit board 102 other than the RF structure 114. For example, the component 106 (in the stack 122 or 132, or both) can be cooled by the frame 134. In providing that cooling, the frame 134 can facilitate heat spreading and reduce thermal resistance. For example, the thickness of the frame can be selected so as to provide adequate heat spreading.

The thickness of the frame 134 in the direction between the circuit board 102 and the heat carrier 118 can influence or define one or more other dimensions in the apparatus 100. The frame 134 can be designed so as to keep the circuit board 102 (e.g., the RF structure 114 thereof) at a proper distance from the heat carrier 118. In some implementations, the inlay 126 is chosen at least partially based on the thickness of the frame 134 and the depth of the cavity 130. For example, the inlay 126 can be designed to have a thickness that is at least half of the thickness of the frame 134. In some implementations, the inlay 126 can have the largest size that can be accommodated by the cavity 130 and can then be (essentially) as thick as the frame 134. In some implementations, the inlay 126 can be thicker than the cavity 130 (i.e., thicker than the frame 134). The inlay 126 can then be partially accommodated by a cavity in the heatsink or other heat carrier. The TIM 124, as exemplified earlier, can compensate for a tolerance variation in the apparatus 100, including, but not limited to, compensating for a tolerance variation in the frame 134.

The MSCS 116 can include a layer 136 positioned between the bottom layer 112 and the frame 134 (in the stack 122 and/or 132), or between the bottom layer 112 and the TIM 124 (in the stack 120), or both. In some implementations, the layer 136 can couple the bottom layer 112 and the frame 134 to each other and provide thermal conductivity. For example, the layer 136 can include an adhesive, glue and/or thermal grease.

The apparatus 100 is an example of an apparatus that includes a circuit board (e.g., the circuit board 102) having an RF structure (e.g., the RF structure 114 at a first location thereof (e.g., the location on the bottom layer 112 facing the stack 120), the RF structure formed from a conductive trace of the circuit board. The apparatus has a heat carrier (e.g., the heat carrier 118) and a multi-stack cooling structure (e.g., the MSCS 116) coupling the circuit board and the heat carrier to each other. The MSCS includes a first stack (e.g., the stack 120) adjacent the RF structure at the first location and a second stack (e.g., the stack 122) at a second location (e.g., the location on the bottom layer 112 facing the stack 122). The first stack includes an inlay (e.g., the inlay 126) adjacent the heat carrier, and a thermal interface material (e.g., the TIM 124) that couples the inlay and the circuit board to each other. The inlay has higher thermal conductivity and higher rigidity than the thermal interface material (e.g., by the inlay being made from ceramics or ferrite versus the TIM being made from soft thermal pad, adhesive, bonding film, prepreg or glue).

Figure 2:
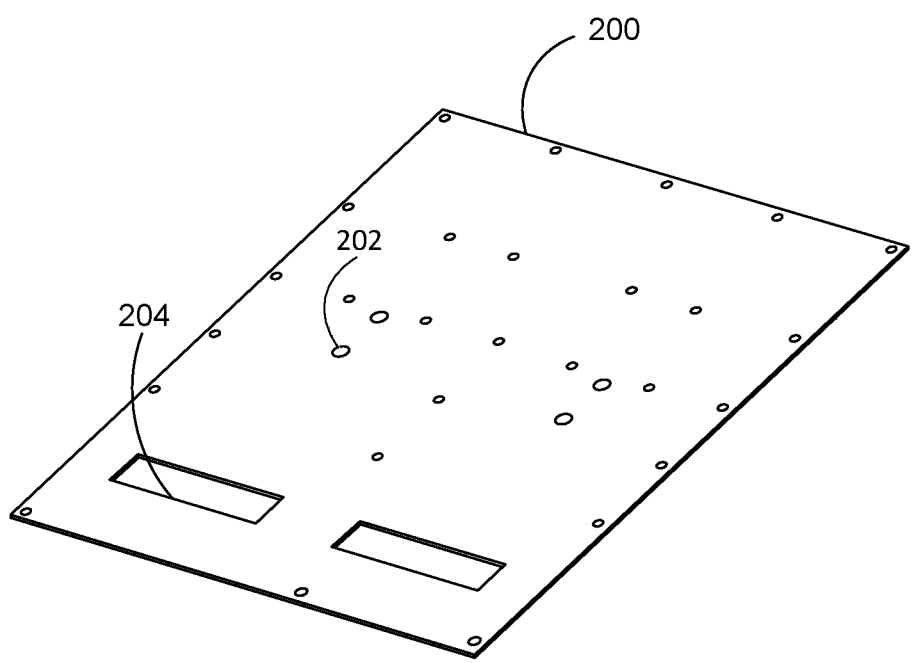
FIG. 2 shows an example of a circuit board.

FIG. 2 shows an example of a circuit board 200. The circuit board 200, can be used with one or more examples described herein. For example, the circuit board 200 can serve as the circuit board 102 (FIG. 1). The circuit board 200 can be made from a clad metal substrate, or a composite material, to name just two examples. The circuit board 200 can be a PCB that has one or more conductive traces on either or both surfaces thereof. The circuit board 200 can have any suitable shape, including, but not limited, to, rectangular.

The circuit board 200 can include one or more surface features that facilitate the functions of components. In some implementations, the circuit board 200 has one or more via connections 202. For example, the via connection 202 can provide a connection from one side of the circuit board 200 (e.g., from the top layer 104 in FIG. 1) to circuitry (e.g., an RF structure) at an opposite side (e.g., at the bottom layer 112 in FIG. 1) of the circuit board 200.

The circuit board 200 can include one or more openings. Here, the circuit board 200 has two recesses 204. In some implementations, the recess(es) 204 can be open toward both of the opposing surfaces of the circuit board 200. The recess(es) 204 can be used for accommodating one or more components not mounted to the circuit board 200, for example as will be described below.

Figure 3:
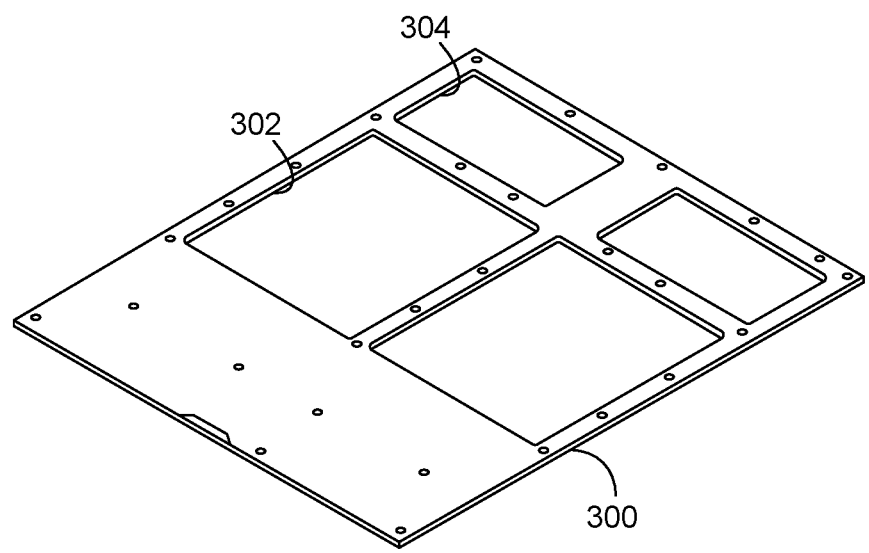
FIG. 3 shows an example of a frame.

FIG. 3 shows an example of a frame 300. The frame 300 can be used with one or more examples described herein. For example, the frame 300 can serve as the frame 134 (FIG. 1). The frame 300 can be made from metal (e.g., copper), or PCB substrate, to name just two examples. The frame 300 can have any suitable shape, including, but not limited, to, rectangular.

The frame 300 can include one or more openings. Here, the frame 300 has two recesses 302 and two recesses 304. In some implementations, the recess(es) 302 can be open toward both of the opposing surfaces of the frame 300. The recess(es) 302 can be used for accommodating an RF structure having a central opening, for example as will be described below. In some implementations, the recess(es) 304 can be open toward both of the opposing surfaces of the frame 300. The recess(es) 304 can be used for accommodating an RF structure that does not have a central opening, for example as will be described below.

Figure 4:
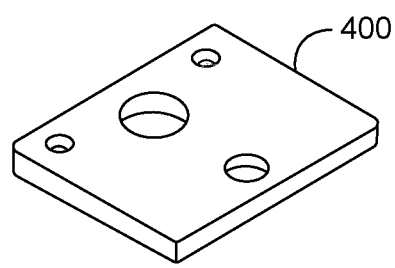
FIG. 4 shows an example of a frame islet.

FIG. 4 shows an example of a frame islet 400. The frame islet 400 can be used with one or more examples described herein. For example, the frame islet 400 can serve as an island to support (components on) a portion of a circuit board, such as when surrounded by an RF structure, for example as will be described below. The frame islet 400 can be made from metal (e.g., copper), or PCB substrate, to name just two examples. The frame islet 400 can have any suitable shape, including, but not limited, to, rectangular.

Figure 5:
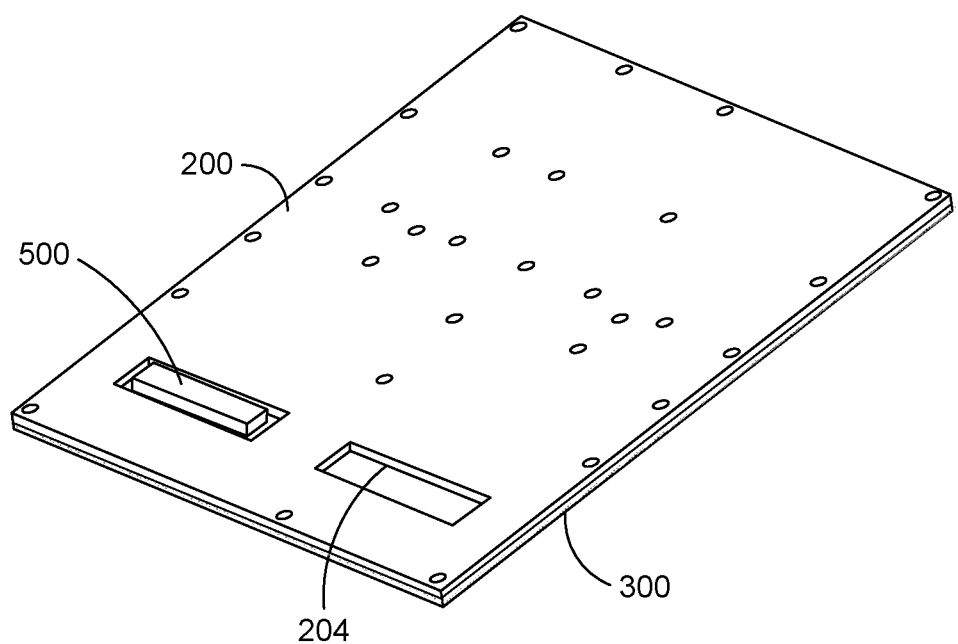
FIGS. 5-8 show examples of assemblies.

FIGS. 5-9 show examples of assemblies. The assemblies can illustrate various stages of assembly of an apparatus, such as any of the apparatuses described herein. In FIG. 5, the circuit board 200 and the frame 300 are shown coupled to each other. For example, this can correspond to the coupling in FIG. 1 of the circuit board 102 and the frame 134 to each other. A portion of the circuit board 200 that covers the recesses 302 and 304 (FIG. 3) of the frame 300 can be provided with one or more RF structures, including, but not limited to, an inductor, transformer and/or a transmission line. For example, the RF structure(s) can be located at the surface of the circuit board 200 facing the recesses 302 and 304, or at the surface on the opposite side of the circuit board 200, or both.

One or more components can be mounted to the frame 300 that is not mounted to the circuit board 200. Here, a component 500 is mounted to the frame 300. The recess 204 of the circuit board 200 can accommodate the component 500. For example, the component 500 can fill almost the entire recess 204. In some implementations, the component 500 can be a power transistor, power resistor, etc. that will be cooled directly by the frame 300 (e.g., by a metallic material). For example, when the component 500 is positioned directly onto the frame 300 there is no thermal resistance of the circuit board between the component 500 and the heat carrier. Additionally, heat from the component 500 does not travel only directly toward the heat carrier (not shown), but can spread within the frame 300. Having a suitable thickness of the frame 300, based on the other characteristics of the implementation, can reduce the thermal resistance between the component 500 and the heat carrier. For example, if the thickness of the frame 300 is too large, the heat will spread but there may be additional thermal resistance from the material of the frame 300 (e.g., copper). But if the thickness of the frame is too small, no significant heat spreading will be provided.

The above example illustrates that an apparatus can include a power transistor (e.g., the component 500) mounted to a frame (e.g., the frame 300) and that a circuit board (e.g., the circuit board 200) can include a recess (e.g., the recess 204) that accommodates the power component, e.g., a transistor.

Figure 6:
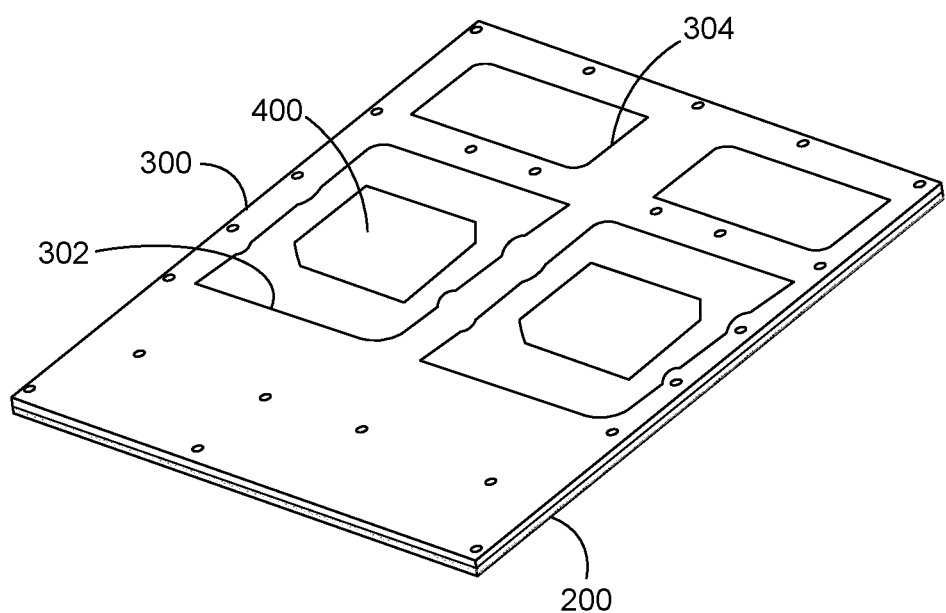

FIG. 6 shows the frame 300 and the circuit board 200 from another perspective than in FIG. 5, where the recesses 302 and 304 are currently visible. The frame islet 400 has been mounted to the circuit board 200 in the recess 302.

Figure 7:
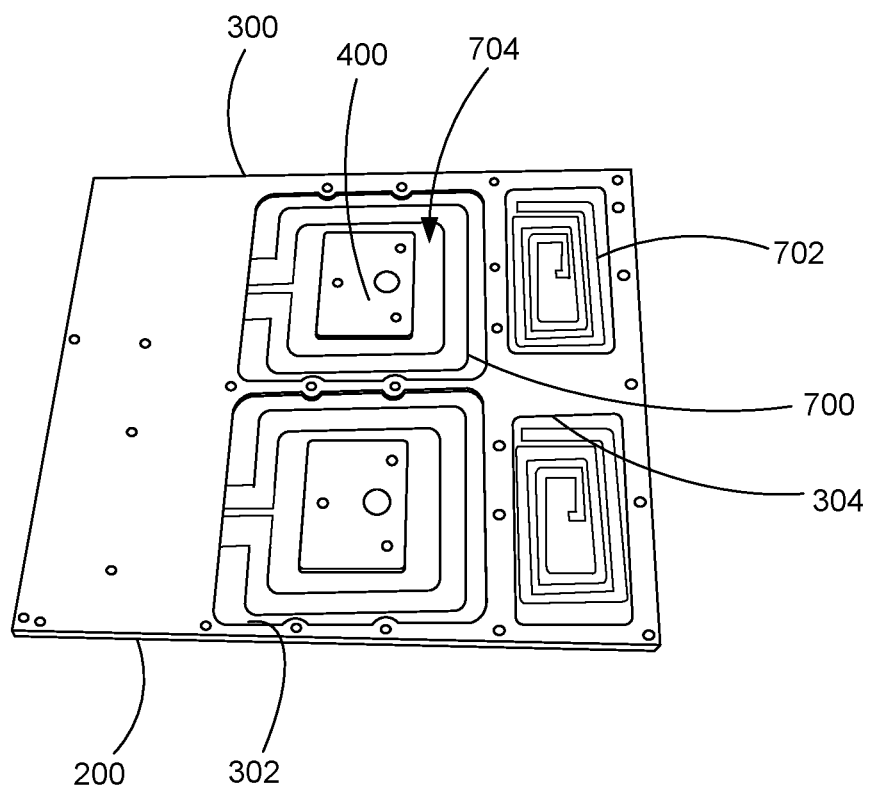

FIG. 7 shows that an RF structure 700 has been positioned onto the circuit board 200, within at least one of the recesses 302 of the frame 300. Similarly, an RF structure 702 has been positioned onto the circuit board 200, within at least one of the recesses 304 of the frame 300. In some implementations, the RF structure 700 can have a central opening 704 that accommodates the frame islet 400 and the component(s) that are mounted to the circuit board 200 for support by the frame islet 400. The supporting of the circuit board by islet 400 is advantageous in order to avoid bending of the circuit board and damaging the components by pressure of the compressed TIM.

Figure 8:
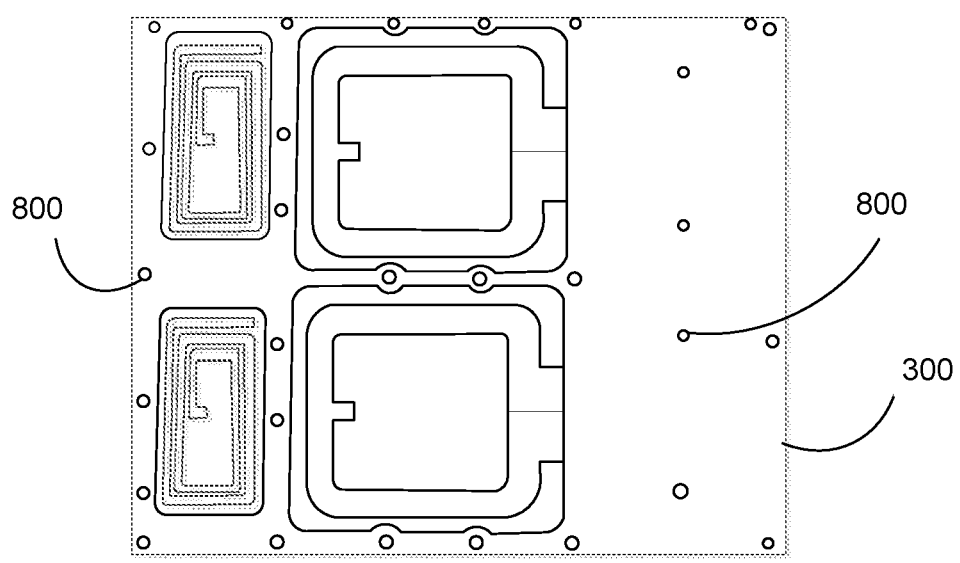

FIG. 8 shows the frame 300 coupled to the circuit board 200 (partially visible through the recesses in the frame 300) by bolts 800. Another form of attachment, such as an adhesive, can additionally or instead be used. The frame 300 can also be coupled to a heat carrier.

Figure 9A:
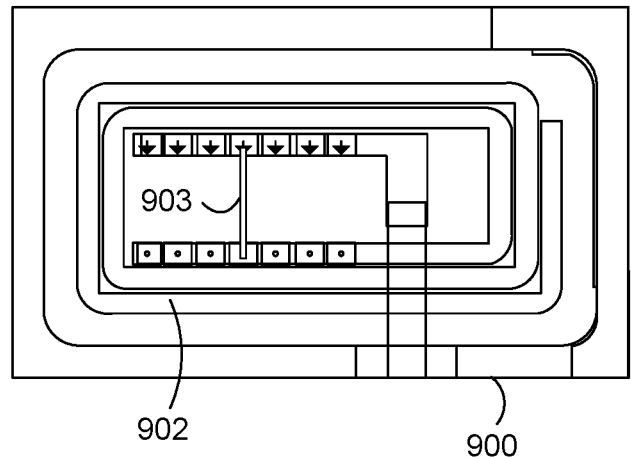
FIGS. 9A-B show an example of an apparatus with an inductor.
Figure 9B:
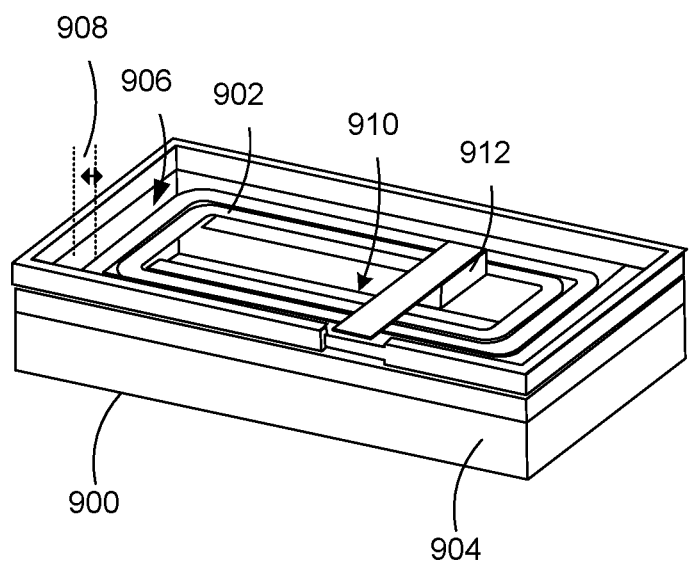

FIGS. 9A-B show an example of an apparatus 900 with an inductor 902. The apparatus 900 and/or the inductor 902 can be used with any example described herein. For example, the RF structure 114 (FIG. 1) can form part of the inductor 902. A jumper pin 903 shown in FIG. 9A can be used for inductance tuning of the inductor 902. The apparatus 900 includes a frame 904 that defines a cavity 906. For example, the frame 134 (FIG. 1) can form part of the frame 904. The cavity 906 can serve a similar or identical function as the cavity 130 (FIG. 1). The inductor 902 can be provided with one or more jumper bridges to adjust inductance. A clearance 908 between an outer periphery of the inductor 902 and an inside surface of the frame 904 can be chosen so that a material of the frame 904 (e.g., metal) does not unduly influence the inductance of the inductor 902. The inductor 902 here has a central opening 910. In some implementations, the central opening 910 can be used to accommodate one or more components (not shown) of the apparatus 900, for example as described next. The inductor 902 can be located at a layer of a circuit board (not shown) that faces a heat carrier (not shown). For example, the inductor 902 can be positioned at the bottom layer 112 (FIG. 1). A via connection 912 can be provided between different layers of the circuit board. For example, the via connection 912 can be positioned between the top layer 104 (FIG. 1) and the bottom layer 112 (FIG. 1). A heat carrier (not shown) can be provided at an opposite side of the frame 904 from the inductor 902.

Figure 10A:
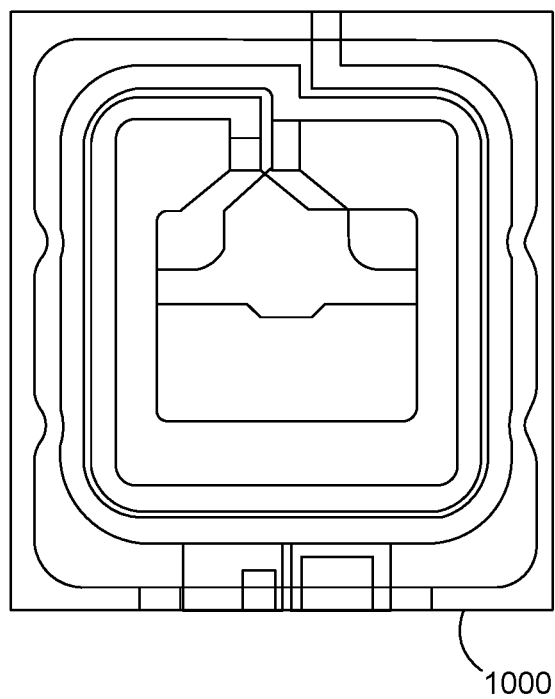
FIGS. 10A-B show an example of an apparatus with a transformer.
Figure 10B:
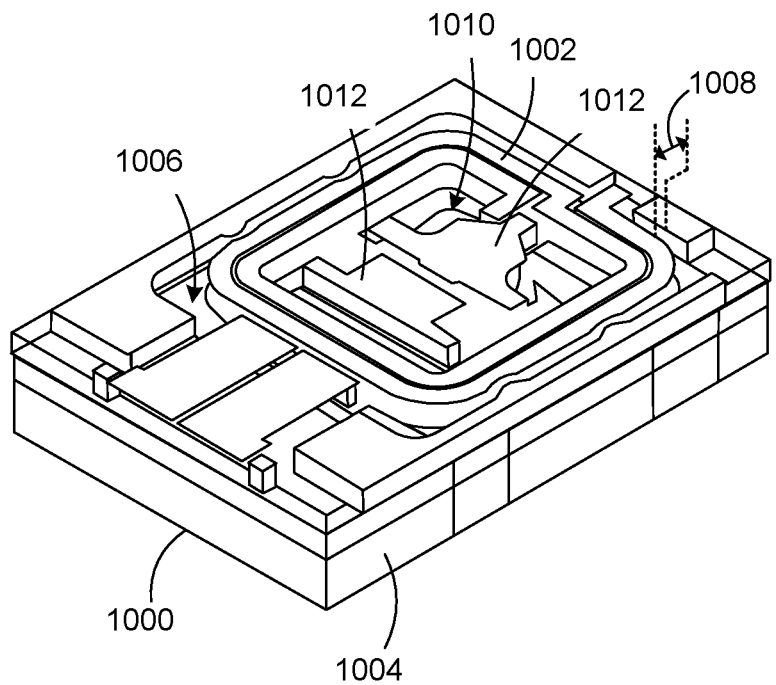

FIGS. 10A-B show an example of an apparatus 1000 with a transformer 1002. The apparatus 1000 and/or the transformer 1002 can be used with any example described herein. For example, the RF structure 114 (FIG. 1) can form part of the transformer 1002 (e.g., the primary or secondary winding thereof). The apparatus 1000 includes a frame 1004 that defines a cavity 1006. For example, the frame 134 (FIG. 1) can form part of the frame 1004. The cavity 1006 can serve a similar or identical function as the cavity 130 (FIG. 1). A clearance 1008 between an outer periphery of the transformer 1002 and an inside surface of the frame 1004 can be chosen so that a material of the frame 1004 (e.g., metal) does not unduly influence the inductance of the transformer 1002. The transformer 1002 here has a central opening 1010. In some implementations, the central opening 1010 can be used to accommodate one or more components 1012 of the apparatus 1000. In some implementations, the component(s) 1012 can be components other than inductors, transformers or transmission lines. For example, the component(s) 1012 can be a resistor and/or a capacitor. The component(s) 1012 can be supported by the frame islet 400 (FIG. 4) to avoid their damage due to PCB bending. The component(s) 1012 can be mounted to a surface of the circuit board (e.g., the top layer 104 in FIG. 1) that is further away from the heat carrier. A heat carrier (not shown) can be provided at an opposite side of the frame 904 from the transformer 1002.

A primary winding of the transformer 1002 can be located at a layer of a circuit board (not shown) and a secondary winding of the transformer 1002 can be located at the same or an opposite layer of the circuit board. For example, one of the primary and secondary windings can be positioned at the top layer 104 (FIG. 1) and the other of the primary and secondary winding can be positioned at the bottom layer 112 (FIG. 1).

The apparatus 1000 is an example of an apparatus wherein an RF structure (e.g., the transformer 1002) has a central opening (e.g., the central opening 1010) and wherein the apparatus includes a component (e.g., the component(s) 1012) on a circuit board aligned with the central opening. The apparatus 1000 exemplifies that a frame islet (e.g., the frame islet 400) can be coupled to the circuit board, the frame islet supporting the component (e.g., the component(s) 1012).

Figure 11A:
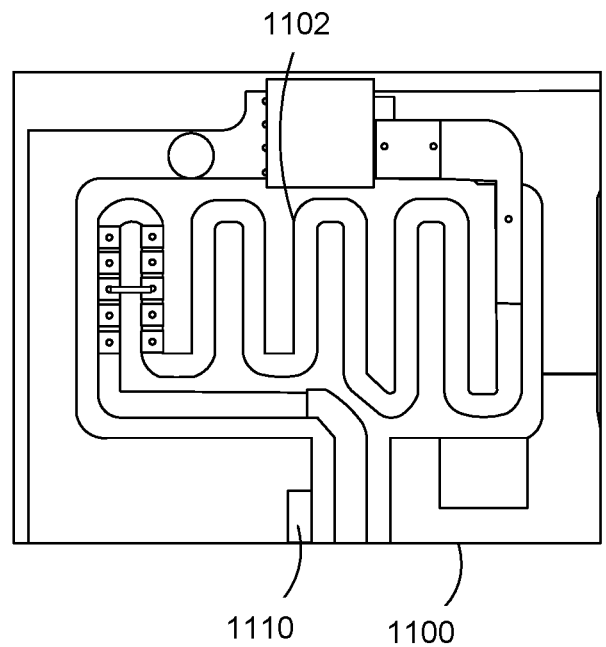
FIGS. 11A-B show an example of an apparatus with a transmission line.
Figure 11B:
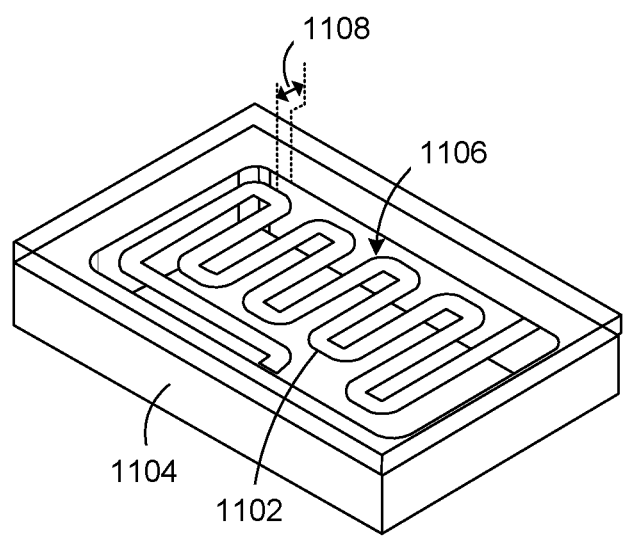

FIGS. 11A-B show an example of an apparatus 1100 with a transmission line 1102. The apparatus 1100 and/or the transmission line 1102 can be used with any example described herein. For example, the RF structure 114 (FIG. 1) can form part of the transmission line 1102. The transmission line 1102 can be considered a microstrip. The apparatus 1100 includes a frame 1104 that defines a cavity 1106. For example, the frame 134 (FIG. 1) can form part of the frame 1104. The cavity 1106 can serve a similar or identical function as the cavity 130 (FIG. 1). A clearance 1108 between an outer periphery of the transmission line 1102 and an inside surface of the frame 1104 can be chosen so that a material of the frame 1104 (e.g., metal) does not unduly influence the impedance of the transmission line 1102. The transmission line 1102 here meanders through the space provided by the cavity 1106. A component 1110 can be positioned on the frame 1104 and thereby be cooled by the frame 1104. A heat carrier (not shown) can be provided at an opposite side of the frame 1104 from the transmission line 1102.

Figure 12:
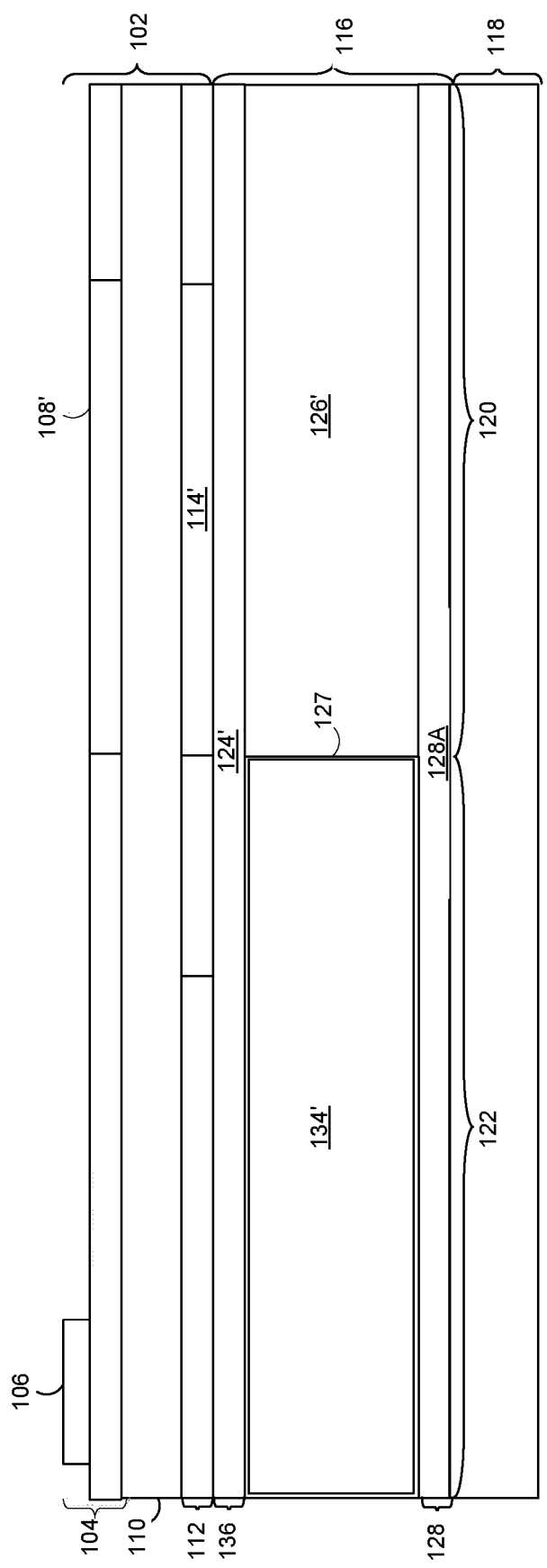
FIG. 12 shows another example of the apparatus in FIG. 1.

FIG. 12 shows another example of the apparatus 100 in FIG. 1. The apparatus 100 can be used with any examples described herein. Some elements of the apparatus correspond to elements of the same reference numbers in FIG. 1, and are not mentioned in the following. RF structures 108' and 114' can be planar inductive components of the circuit board 102. The MSCS 116 here includes the stacks 120 and 122, wherein the stack 122 includes the portion 128A of the layer 128 (e.g., a thermal material), a metal layer 134' (e.g., copper), and a TIM 124'. The metal layer 134' is here not shaped as a frame and the stack 120 is here not formed in any cavity or recess. Rather, the metal layer 134' can have a polygonal shape (e.g., a pad or other rectangular shape). The stack 120 is formed adjacent the stack 122. The stack 120 includes the portion 128A, a dielectric layer 126' (e.g., a ceramic pad), and the TIM 124'. That is, the portion 128A and/or the TIM 124' can be common to the stacks 120 and 122. The dielectric layer 126' can have a polygonal shape (e.g., a pad or other rectangular shape). The metal layer 134' and the dielectric layer 126' can have the same shape as each other, or different shapes. The apparatus 100 can include one or more of the metal layer 134' (e.g., one or more metal pads). The apparatus 100 can include one or more of the dielectric layer 126' (e.g., one or more ceramic pads). The stack 120 is positioned adjacent (e.g., underneath) the RF structures 108' and 114' to provide cooling for the circuit board 102 without significant deterioration of inductance and/or impedance. The apparatus 100 can also include one or more instances of a frame-based stack approach (e.g., as described with reference to FIG. 1). As another example, an apparatus using a frame-based stack approach (e.g., as described with reference to FIG. 1) can also include one or more instances corresponding to the present example.

The metal layer 134' can have at least one layer 127 covering all or some of its outer surface. The layer 127 can result from a surface treatment of the metal layer 134' to protect against oxidation. In some implementations, the layer 127 can include tin. In some implementations, the layer 127 can include gold. For example, the gold can be applied over a nickel plating of the metal layer 134'. The circuit board 102 may be treated with a similar or identical substance as in the layer 127 applied to the metal layer 134'.

FIGS. 13A-C show examples of arrangements with circuit boards. In FIG. 13A, a circuit board 1300 (e.g., a PCB) is shown in a top view and has a dielectric layer 1302 (e.g., a ceramic material) and a metal layer 1304 (e.g., copper). The circuit board 1300, the dielectric layer 1302 and the metal layer 1304 can be used with any examples described herein. For example, the dielectric layer 1302 can be used to provide cooling for planar inductive components of the circuit board 1300. For example, the metal layer 1304 can be used to provide cooling for non-planar (e.g., soldered) components of the circuit board 1300. Here, the dielectric layer 1302 and the metal layer 1304 are placed side by side on the circuit board 1300 (e.g., attached thereto by an adhesive material). The dielectric layer 1302 and the metal layer 1304 form a boundary 1306 between them. Use of the dielectric layer 1302 and the metal layer 1304 can avoid the need to machine recesses or cavities in a metal layer (compare the layer 134 in FIG. 1 which has the cavity 130). Accordingly, the present examples can represent a less costly and/or simpler way of providing cooling.

One or more components can be positioned in direct contact with the metal layer 1304. In some implementations, the circuit board 1300 can include at least one recess 1308 facing the metal layer 1304. The recess 1308 can serve a similar or identical purpose as the recess 204 (FIG. 2). For example, the recess 1308 can accommodate one or more power components 1310 (e.g., a transistor) to be mounted to the metal layer 1304. The recess 1308 and the power component 1310 are shown in phantom because they are obscured by the metal plate 1304 in this example.

In FIG. 13B, the dielectric layer 1302 and the metal layer 1304 are spaced apart compared to in the example in FIG. 13A. A layer 1312 is placed between the dielectric layer 1302 and the metal layer 1304. In some implementations, the layer 1312 includes a material with adhesive properties, including, but not limited to, pre-preg. For example, in an assembly process when the dielectric layer 1302 and the metal layer 1304 are being adhered to the circuit board 1300 (e.g., by application of pre-preg), the adhesive can enter into the spacing between the dielectric layer 1302 and the metal layer 1304 (e.g., during a pressing operation).

The circuit board 1300 can be provided with one or more of the dielectric layer 1302. The circuit board 1300 can be provided with one or more of the metal layer 1304. Each of the dielectric layer 1302 and the metal layer 1304 can have any shape and/or size that is suitable considering the circuit board 1300 and the respective components thereof. FIG. 13C shows that the circuit board 1300 has the dielectric layer 1302 as in previous examples. Adjacent the dielectric layer 1302 is placed a metal layer 1304' that is smaller than the metal layer 1304 (FIGS. 13A-B). Another dielectric layer 1302' is placed adjacent the dielectric layer 1302 and the metal layer 1304'. For example, this can correspond to the apparatus having more that two (e.g., three or more), stacks in its multi-stack cooling structure. The configuration in FIG. 13C can be used when the circuit board 1300 has a larger proportion of planar inductive components than soldered components. The dielectric layers 1302 and 1302' can be one integral layer in some implementations.

Further implementations are summarized in the following examples:

Example 1: An apparatus comprising: a circuit board having a radiofrequency (RF) structure at a first location thereof, the RF structure formed from a conductive trace of the circuit board; a heat carrier; and a multi-stack cooling structure coupling the circuit board and the heat carrier to each other, the multi-stack cooling structure including a first stack adjacent the RF structure at the first location and a second stack at a second location, the first stack including an inlay adjacent the heat carrier, and a first thermal interface material that couples the inlay and the circuit board to each other, the inlay having higher thermal conductivity and higher rigidity than the first thermal interface material.

Example 2: The apparatus of Example 1, wherein the second stack is formed by a frame coupled to the circuit board.

Example 3: The apparatus of Example 2, further comprising a cavity in the frame, the cavity accommodating the first stack.

Example 4: The apparatus of any of Examples 2 or 3, wherein the first thermal interface material compensates for a tolerance variation in the frame.

Example 5: The apparatus of any of Examples 2 to 4, wherein the frame includes at least one of metal or circuit hoard substrate.

Example 6: The apparatus of any of Examples 2 to 5, wherein the first thermal interface material further couples the frame to the circuit board.

Example 7: The apparatus of any of Examples 2 to 6, further comprising a second thermal interface material that couples the frame to the circuit board.

Example 8: The apparatus of any of Examples 2 to 7, wherein a dimension of the inlay in a direction between the circuit board and the heat carrier is greater than half of a dimension of the frame in the direction.

Example 9: The apparatus of any of Examples 2 to 8, further comprising a power component mounted to the frame at the second location, the circuit board including a cavity that accommodates the power component.

Example 10: The apparatus of any preceding Example, wherein the first thermal interface material includes at least one of thermal pad, adhesive, bonding film, matrix-fiber aggregate, solder or glue.

Example 11: The apparatus of any preceding Example, wherein the RF structure has a central opening, further comprising at least one component on the circuit board aligned with the central opening.

Example 12: The apparatus of Example 11, further comprising a frame islet coupled to the circuit board, the frame islet supporting the component.

Example 13: The apparatus of Example 12, wherein the circuit board has a first layer facing the frame islet, and a second layer opposite the first layer, the at least one component mounted to the second layer.

Example 14: The apparatus of any preceding Example, wherein the RF structure includes at least one of an inductor, a transformer, or a transmission line.

Example 15: The apparatus of any preceding Example, wherein the circuit board has a first layer facing the multi-stack cooling structure, and a second layer opposite the first layer.

Example 16: The apparatus of Example 15, wherein the RF structure is located at the first layer.

Example 17: The apparatus of any preceding Example, wherein the inlay includes at least one of a ceramic material or a ferromagnetic ceramic material.

Example 18: An apparatus comprising: a printed circuit board having a radiofrequency (RF) structure at a first location of a first surface thereof, the printed circuit board having a second surface opposite the first surface, the RF structure formed from a conductive trace of the printed circuit board and including at least one of an inductor, a transformer, or a transmission line; a heat carrier including at least one of a heatsink or a water cooling plate; and a multi-stack cooling structure coupling the printed circuit board and the heat carrier to each other, the multi-stack cooling structure including a first stack adjacent the RF structure at the first location and a second stack at a second location, the first stack including a ceramic pad coupled to the heat carrier by thermal grease, and a thermal interface material including at least one of thermal pad, adhesive, bonding film, matrix-fiber aggregate, solder, or glue, that couples the ceramic pad and the printed circuit board to each other, the ceramic pad having higher thermal conductivity and higher rigidity than the thermal interface material, the second stack including a frame coupled to the heat carrier by the thermal grease, the frame including at least one of copper and a circuit board substrate, the frame coupled to the first surface of the printed circuit board by adhesive, the frame having a cavity therein that accommodates the first stack.

A number of embodiments have been described. Nevertheless, it will be understood that various modifications may be made without departing from the spirit and scope of the specification.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

While certain features of the described implementations have been illustrated as described herein, many modifications, substitutions, changes and equivalents will now occur to those skilled in the art. It is, therefore, to be understood that appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus comprising:
a circuit board having a radiofrequency (RF) structure at a first location thereof, the RF structure formed from a conductive trace of the circuit board;
a heat carrier; and
a multi-stack cooling structure coupling the circuit board and the heat carrier to each other, the multi-stack cooling structure including a first stack adjacent the RF structure at the first location and a second stack at a second location, the first stack including a dielectric layer adjacent the heat carrier, and a thermal interface material (TIM) that couples the dielectric layer and the circuit board to each other, the dielectric layer having higher thermal conductivity and higher rigidity than the TIM, the second stack including a metal layer adjacent the heat carrier, and a TIM that couples the metal layer and the circuit board to each other.

2. The apparatus of claim 1, Therein the TIM includes at least one of a thermal pad, an adhesive, a bonding film, a matrix-fiber aggregate, a solder, or a glue.

3. The apparatus of claim 1, wherein the RF structure has a central opening, the apparatus further comprising at least one component on the circuit board aligned with the central opening.

4. The apparatus of claim 1, wherein the RF structure includes at least one of an inductor, a transformer, or a transmission line.

5. The apparatus of claim 1, wherein the circuit board has a first layer facing the multi-stack cooling structure, and a second layer opposite the first layer.

6. The apparatus of claim 5, wherein the RF structure is located at the first layer.

7. The apparatus of claim 1, wherein the dielectric layer includes at least one of a ceramic material or a ferromagnetic ceramic material.

8. The apparatus of claim 1, wherein the dielectric layer and the metal layer have a common shape.

9. The apparatus of claim 1, wherein the dielectric layer and the metal layer have a common size.

10. The apparatus of claim 1, further comprising a plating on a surface of the metal layer.

11. The apparatus of claim 10, wherein the plating includes at least one of tin or gold.

12. The apparatus of claim 1, wherein the multi-stack cooling structure includes more than two stacks between the circuit board and the heat carrier.

13. The apparatus of claim 1, further comprising a power component mounted to the metal layer.

14. The apparatus of claim 13, further comprising a recess in the circuit board that accommodates the power component.

15. An apparatus comprising:
a printed circuit board having a radiofrequency (RF) structure at a first location of a first surface thereof, the printed circuit board having a second surface opposite the first surface, the RF structure formed from a conductive trace of the printed circuit board and including at least one of an inductor, a transformer, or a transmission line;
a heat carrier including at least one of a heatsink or a water cooling plate; and
a multi-stack cooling structure coupling the printed circuit board and the heat carrier to each other, the multi-stack cooling structure including a first stack adjacent the RF structure at the first location and a second stack at a second location, the first stack including a dielectric pad coupled to the heat carrier, and a thermal interface material including at least one of a thermal pad, an adhesive, a bonding film, a matrix-fiber aggregate, a solder, or a glue, that couples the dielectric pad and the printed circuit board to each other, the dielectric pad having higher thermal conductivity and higher rigidity than the thermal interface material, the second stack including a metal layer coupled to the heat carrier, the metal layer coupled to the first surface of the printed circuit board, the first stack being adjacent the second stack.

* * * * *